(12) United States Patent
Kang et al.

(10) Patent No.: US 9,362,137 B2
(45) Date of Patent: Jun. 7, 2016

(54) PLASMA TREATING APPARATUS, SUBSTRATE TREATING METHOD, AND METHOD OF MANUFACTURING A SEMICONDUCTOR DEVICE

(71) Applicants: Sungho Kang, Osan-si (KR); Sunyoung Lee, Yongin-si (KR); Jaehee Lee, Daegu (KR); Han Ki Lee, Hwaseong-si (KR); Geunkyu Choi, Hwaseong-si (KR)

(72) Inventors: Sungho Kang, Osan-si (KR); Sunyoung Lee, Yongin-si (KR); Jaehee Lee, Daegu (KR); Han Ki Lee, Hwaseong-si (KR); Geunkyu Choi, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/693,873

(22) Filed: Apr. 23, 2015

(65) Prior Publication Data

US 2016/0049312 A1    Feb. 18, 2016

(30) Foreign Application Priority Data

Aug. 18, 2014 (KR) .......................... 10-2014-0107130

(51) Int. Cl.
*H05H 1/00* (2006.01)
*H01L 21/324* (2006.01)
*H01L 21/02* (2006.01)
*H01L 21/285* (2006.01)
(Continued)

(52) U.S. Cl.
CPC ........ *H01L 21/324* (2013.01); *H01L 21/02057* (2013.01); *H01L 21/0262* (2013.01); *H01L 21/02274* (2013.01); *H01L 21/28556* (2013.01); *H01L 21/3065* (2013.01); *H01L 21/31058* (2013.01); *H01L 21/31116* (2013.01); *H01L 21/31138* (2013.01); *H01L 21/32136* (2013.01)

(58) Field of Classification Search
CPC ................ H01J 37/321; H01J 37/3244; C23C 16/45565; C23C 16/45574; H05H 1/46
See application file for complete search history.

(56) References Cited

U.S. PATENT DOCUMENTS 6,013,155 A * 1/2000 McMillin .............. C23C 16/455
                                                                118/723 I
6,143,078 A * 11/2000 Ishikawa ........... H01L 21/67017
                                                                118/715

(Continued)

FOREIGN PATENT DOCUMENTS

JP         3422583 B2    6/2003
JP         4153048 B2    9/2008
(Continued)

*Primary Examiner* — Jaehwan Oh
(74) *Attorney, Agent, or Firm* — Muir Patent Law, PLLC

(57) ABSTRACT

A substrate treating method may be performed by a plasma treating apparatus. The substrate treating method may include: providing a substrate on a platform in a lower portion of an inner space of a process chamber; directing a first process gas upward from a first nozzle formed at an inner wall of the process chamber into an upper portion of the inner space, the first process gas being an inert gas and wherein the first nozzle is an obliquely upward-oriented nozzle structured to direct the first process gas upward; directing a second process gas downward from a second nozzle formed at a inner wall of the process chamber into a lower portion of the inner space, the second process gas being hydrogen gas and wherein the second nozzle is an obliquely downward-oriented nozzle structured to direct the second process gas downward; and applying a microwave to the upper portion of the inner space to excite the first process gas and the second process gas into plasma, and then processing the substrate.

19 Claims, 9 Drawing Sheets

(51) Int. Cl.
*H01L 21/3065* (2006.01)
*H01L 21/3213* (2006.01)
*H01L 21/311* (2006.01)
*H01L 21/3105* (2006.01)

(56) References Cited

U.S. PATENT DOCUMENTS

| | | | | |
|---|---|---|---|---|
| 6,432,259 | B1 * | 8/2002 | Noorbakhsh | H01J 37/321 |
| | | | | 118/723 E |
| 7,303,141 | B2 * | 12/2007 | Han | C23C 16/4558 |
| | | | | 118/715 |
| 7,651,587 | B2 | 1/2010 | Lu et al. | |
| 7,655,111 | B2 | 2/2010 | Horguchi | |
| 8,383,002 | B2 | 2/2013 | Katz et al. | |
| 8,906,249 | B2 * | 12/2014 | Hiroshima | C23C 16/45574 |
| | | | | 216/68 |
| 9,051,647 | B2 * | 6/2015 | Cooperberg | C23C 16/45574 |
| 2011/0203735 | A1 | 8/2011 | Seo et al. | |
| 2013/0052830 | A1 | 2/2013 | Kim et al. | |
| 2014/0117629 | A1 | 5/2014 | Biallas et al. | |

FOREIGN PATENT DOCUMENTS

| | | |
|---|---|---|
| JP | 5068458 B1 | 11/2012 |
| KR | 10-0855875 B1 | 9/2008 |
| KR | 10-2008-0098992 A | 11/2008 |
| KR | 10-092122 B1 | 12/2011 |

* cited by examiner

PLASMA TREATING APPARATUS, SUBSTRATE TREATING METHOD, AND METHOD OF MANUFACTURING A SEMICONDUCTOR DEVICE

CROSS-REFERENCE TO RELATED APPLICATIONS

This U.S. non-provisional patent application claims priority under 35 U.S.C. §119 to Korean Patent Application No. 10-2014-0107130, filed on Aug. 18, 2014, the entire contents of which are hereby incorporated by reference.

BACKGROUND

The present disclosure herein relates to a plasma treating apparatus and a substrate treating method.

Plasma is generated by high temperature, an intense electric field, or an RF electromagnetic field, and includes an ionized gas state comprised of ions, electrons, radicals or the like. In a semiconductor device fabrication process, deposition and etching processes may be performed by using a material in the plasma state. Also, in the semiconductor device fabrication process, an annealing process may be performed by using the material in the plasma state.

Like this, the processes using the plasma state material are performed by collisions of particles in an ionized state or a radical state with a substrate. When particles colliding with the substrate have excessively high energy, damage to the substrate may be incurred.

SUMMARY

The present disclosure provides a plasma treating apparatus and a substrate treating method for efficiently treating a substrate.

Embodiments of the inventive concept provide plasma treating apparatuses including: a process chamber having an inner space that is formed therein; a microwave applying unit configured to excite a gas of the inner space into plasma; a first nozzle formed in an inner wall of the process chamber, the first nozzle structured to direct a first process gas toward an upper portion of the inner space; and a second nozzle formed in the inner wall of the process chamber, the second nozzle structured to direct a second process gas toward a lower portion of the inner space.

In other embodiments of the inventive concept, substrate treating methods include: disposing a substrate on a platform in a lower portion of an inner space of a process chamber; directing a first process gas upward from a first nozzle formed at an inner wall of the process chamber into an upper portion of the inner space, the first process gas being an inert gas and wherein the first nozzle is an obliquely upward-oriented nozzle structured to direct the first process gas upward; and directing a second process gas downward from a second nozzle formed at an inner wall of the process chamber into a lower portion of the inner space, the second process gas being hydrogen gas and wherein the second nozzle is an obliquely downward-oriented nozzle structured to direct the second process gas downward; and applying a microwave to the upper portion of the inner space to excite the first process gas and the second process gas into plasma, and then treating the substrate.

In other embodiments, a method includes: placing a substrate on a platform in an inner space of a process chamber; directing a first process gas upward from an inner wall of the process chamber into an upper portion of the inner space, the first process gas being an inert gas and the inner wall being structured to direct the first process gas obliquely upward; directing a second process gas downward from the inner wall of the process chamber into a lower portion of the inner space where the substrate is located, the second process gas being hydrogen gas and the inner wall being structured to direct the second process gas obliquely downward; applying a microwave to the upper portion of the inner space to excite the first process gas and the second process gas into plasma; and processing the substrate in the plasma environment.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
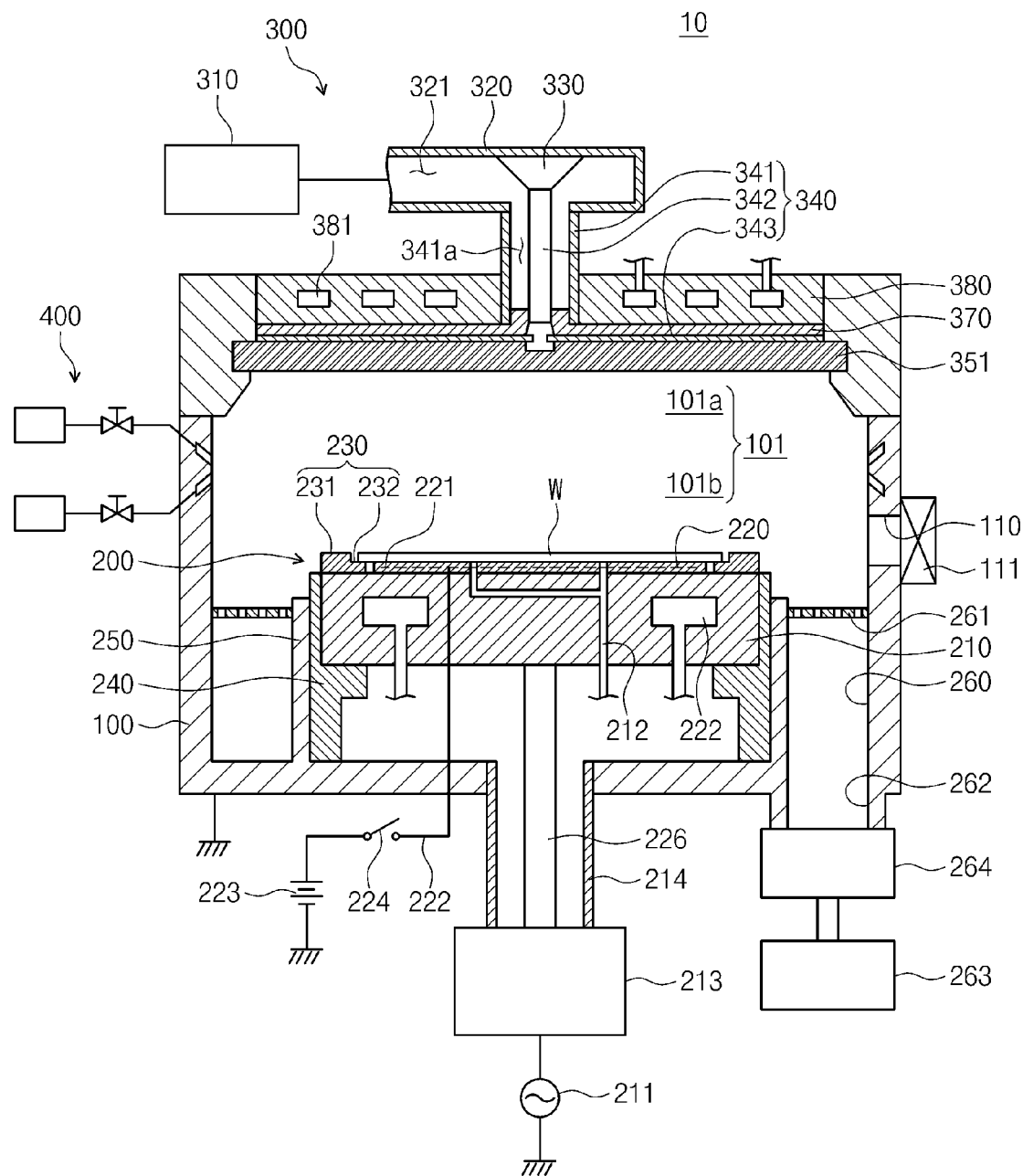
FIG. 1 is a view illustrating a plasma treating apparatus according to one embodiment of the inventive concept.

Hereinafter, embodiments of the inventive concept will be described in detail with reference to accompanying drawings. The invention may, however, be embodied in many different forms and should not be construed as being limited to the embodiments set forth herein. In the drawings, the thicknesses of layers and regions are exaggerated for clarity. Like numbers may refer to like elements throughout.

These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail— it is impracticable to list every possible variation for every feature described herein. The language of the claims should be referenced in determining the requirements of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another, for example as a naming convention. For example, a first chip could be termed a second chip, and, similarly, a second chip could be termed a first chip without departing from the teachings of the disclosure.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a view illustrating a plasma treating apparatus according to one embodiment of the inventive concept.

Referring to FIG. 1, a plasma treating apparatus includes a process chamber 100, a support member 200, a microwave applying unit 300 and a gas supply unit 400.

The process chamber 100 has an inner space 101 that is formed therein, and the inner space 101 is provided in a space where a substrate W treating process is performed. An opening 110 may be formed on one sidewall of the process chamber 100. The opening 110 is provided as an entrance through which the substrate W is loaded and unloaded into and from the process chamber 100. The opening 110 is opened and closed by a door 111.

The support member 200 is disposed, in one embodiment, on a center of a lower portion in the process chamber 100 to support the substrate W. The support member 200, also referred to herein as a support structure, includes, for example, a susceptor 210 and an electrostatic chuck 220. The support structure may include a platform or stage on which the substrate W is placed. For example, the chuck 220 may constitute a platform or stage.

The susceptor 210 provides a framework for the support member 200. The susceptor 210 may be provided, for example, in a barrel shape of which an upper surface is flat. The susceptor 210 may be provided as a conductor. In certain embodiments, the susceptor 210 is electrically connected to a radio frequency (RF) power source 211. For example, a lower surface of the susceptor 210 may be connected to a support rod 212, and the support rod 212 may be connected to the RF power source 211. Also, a matching unit 213 may be disposed between the support rod 212 and the RF power source 211. The support rod 212 is provided as a conductor having a cylinder, a polygonal column or a hollow barrel shape. The RF power source 211 supplies electric energy for controlling energy of ions used in treating the substrate W. The matching unit 213 performs an impedance matching between the RF power source 211 and a load.

A sealing member 214 is disposed outside the support rod 212. The sealing member 214 may be provided, for example, in a barrel shape, and opposite ends thereof may be connected to the process chamber 100 and the matching unit 213, respectively.

The electrostatic chuck 220 may be disposed on an upper surface of the susceptor 210. The electrostatic chuck 220 may be formed, for example, of an insulating material, and include an electrode 221 therein. The electrode 221 is connected to a power source 223 through an electric wire 222. When a switch 224 disposed on the electric wire 222 is turned on, and then electric power is applied to the electrode 221, the substrate W may be adsorbed to the electrostatic chuck 220 by a coulomb force.

A focus ring 230 disposed outside the electrostatic chuck 220 in a radial direction thereof, may be provided on an upper surface of the susceptor 210. An upper surface of the focus ring 230 may be stepped such that an outer portion 231 is higher than an inner portion 232. In one embodiment, the inner portion 232 of the upper surface of the focus ring 230 is disposed at the same height as an upper surface of the electrostatic chuck 220. The inner portion 232 of the upper surface of the focus ring 230 supports an edge region of the substrate W, which is disposed outside the electrostatic chuck 220. The outer portion 231 of the focus ring 230 is provided so as to surround the edge region of the substrate W.

A coolant path 216 may be formed in the susceptor 210. The coolant path 216 is connected to a pipe line so that coolant is circulated through the coolant path 216. The support member 200 and the substrate W disposed on the support member 200 may be controlled in temperature by coolant circulated through the coolant path 216.

A supply path 226 is formed in the support member 200, and is connected to an upper surface of the support member 200 The supply path 226 supplies a heat transfer medium between a lower surface of the substrate W and an upper surface of the support member 200. The heat transfer medium may be, for example helium.

The susceptor 210 may be supported by a support part 240 so as to be spaced apart from a bottom of the process chamber 100. The support part 240 may be formed, for example of an insulator. An auxiliary support part 250 may be provided on an outer circumference of the support part 240. The auxiliary support part 250 may extend in a barrel shape from the bottom of the process chamber 100 in an upward direction. The auxiliary part 250 may be formed, for example of a conductive material.

A discharge path 260 is formed between an inner wall of the process chamber 100 and the auxiliary support part 250. A baffle plate 261 having a ring shape may be disposed on an upper end or upper portion of the discharge path 260.

At least one discharge hole 262 is formed on a lower portion of a sidewall or lower wall of the process chamber 100. The discharge hole 262 is connected to a pump 263. A valve 264 is provided between the discharge hole 262 and the pump 263. An inside pressure of the process chamber 100 may be reduced to a desired vacuum level through the pump 263. Also, a reaction by-product generated during a process and a gas remaining in the process chamber 100 may be discharged outside the process chamber 100 through the pump 263.

A microwave applying unit 300 is configured to apply and applies a microwave to an inside of the process chamber 100. In one embodiment, the microwave applying unit 300 includes a microwave power source 310, a waveguide 320, a coaxial converter 330, an antenna member 340, a dielectric block 351, a dielectric plate 370, and a cooling plate 380.

The microwave power source 310 is configured to generate and generates a microwave. In an example, a microwave generated in the microwave power source 310 may be in a transverse electric mode (TE mode) having a frequency of 2.3 GHz to 2.6 GHz. The waveguide 320 is disposed on one side of the microwave power source 310. The waveguide 320 is provided in a tube shape of which a cross-section is a polygon or a circle. An inner surface of the waveguide 320 is formed, for example of a conductor. In an example, the inner surface of the waveguide 320 may be formed of gold or silver. The waveguide 320 provides a passage through which a microwave generated in the microwave power source 310 is transferred.

The coaxial converter 330 is disposed inside the waveguide 320. The coaxial converter 330 is disposed on an opposite side of the microwave power source 310. One end of the coaxial converter 330 is fixed to an inner surface of the waveguide 320. In one embodiment, the coaxial converter 330 may be provided in a cone shape of which a cross-section area of a lower end is smaller than that of an upper end. A microwave transferred through an inner space 321 of the waveguide 320 is converted in mode in the coaxial converter 330 and is transmitted in a downward direction. In an example, the microwave may be converted from a transverse electric mode (TE mode) to a transverse electromagnetic mode (TEM mode).

The antenna member 340 transmits the microwave converted in mode in the coaxial converter 330 in a downward direction. The antenna member 340, also referred to as an antenna structure, includes an outer conductor 341, an inner conductor 342, and an antenna 343. The outer conductor 341 is disposed on a lower portion of the waveguide 320. A space 341a connected to an inner space of the waveguide 320 is formed inside the outer conductor 341 in a downward direction.

The inner conductor 342 is disposed inside the outer conductor 341. In one embodiment, the inner conductor 342 is provided in a rod having a cylinder shape, and a longitudinal direction thereof is parallel to a vertical direction. An outer circumference of the inner conductor 342 is spaced apart from an inner surface of the outer conductor 341.

An upper end of the inner conductor 342 is fixed (e.g., attached) to a lower end of the coaxial converter 330. The inner conductor 342 extends in a downward direction, and a lower end thereof is disposed inside the process chamber 100. The lower end of the inner conductor 342 is fixedly coupled to a center of the antenna 343. The inner conductor 342 is vertically disposed on an upper surface of the antenna 343.

The antenna 343 is provided in a plate shape. In an example, the antenna may be provided in a thin circular plate. The antenna 343 is disposed so as to be opposed to the susceptor 210. A plurality of slot holes are formed in the antenna 343.

The dielectric plate 370 is disposed on an upper portion of the antenna 343. The dielectric plate 370 is formed of a dielectric such as alumina, quartz or the like. A microwave transmitted in a vertical direction from the microwave antenna 343 is transmitted in a radial direction of the dielectric plate 370. The microwave transmitted to the dielectric plate 370 is compressed in wavelength to be resonated. The resonated microwave is transmitted into the slot holes of the antenna 343. The microwave passing through the antenna 343 may be converted from the transverse electromagnetic mode (TEM) to a plane wave.

A cooling plate 380 is provided on an upper portion of the dielectric plate 370. The cooling plate 380 cools the dielectric plate 370. The cooling plate 380 may be formed of an aluminum material. The cooling plate 380 may allow a cooling fluid to flow into a cooling path 381 formed therein to cool the dielectric plate 370. A cooling type may be a water cooling type or an air cooling type, for example.

The dielectric block 351 is provided on a lower portion of the antenna 343. An upper surface of the dielectric plate 351 may be spaced a predetermined gap from a lower surface of the antenna 343. Unlike this, the upper surface of the dielectric plate 351 may contact the lower surface of the antenna 343. The dielectric plate 351 is formed of a dielectric such as alumina, quartz or the like. The microwave passing through the slot holes of the antenna 343 is emitted to an upper space 101a via the dielectric block 351. The microwave has a gigahertz frequency. Therefore, in certain embodiments, the microwave has a low transmittance, so it does not reach a lower space 102.

Figure 2:
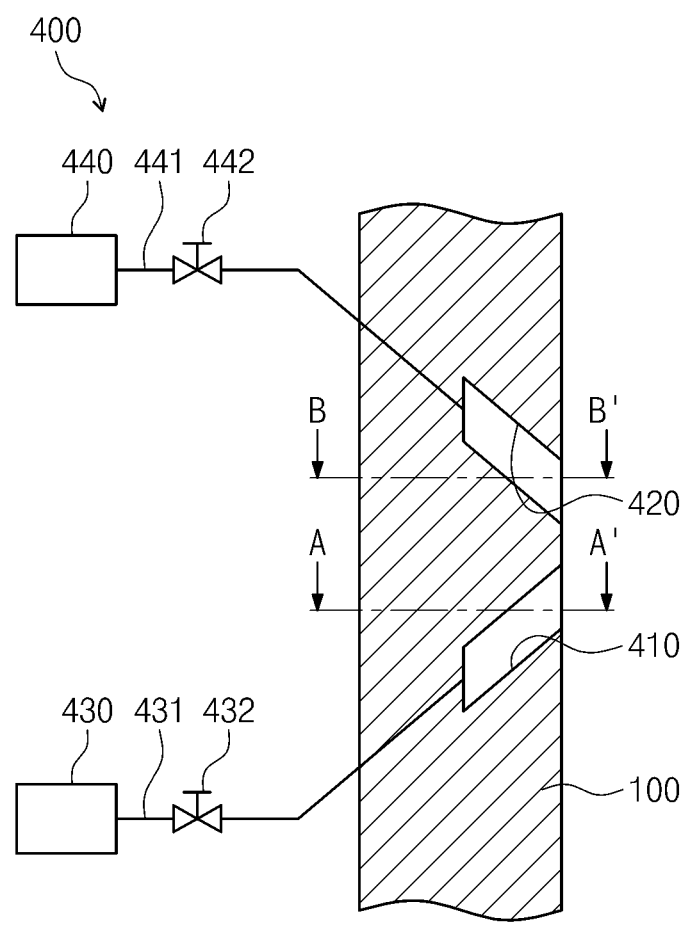
FIG. 2 is an enlarged view illustrating a gas supply unit in a plasma treating apparatus in FIG. 1.

FIG. 2 is an enlarged view illustrating a gas supply unit in the plasma treating apparatus in FIG. 1, according to one exemplary embodiment.

Referring to FIG. 2, a gas supply unit 400 includes a first gas nozzle 410, a second gas nozzle 420, a first supply member 430 and a second supply member 440.

The nozzles 410 and 420 are disposed so as to be embedded in a sidewall of the process chamber 100. The first nozzle 410 may be disposed on a sidewall of a central portion of the process chamber 100, which is spaced apart from an upper surface of the support member 200 and a lower surface of the dielectric block 351. For example, from a vertical perspective, the nozzles 410 and 420 may be located in a sidewall of the process chamber 100 at a central portion vertically between a lower surface of the dielectric block and an upper surface of the support member 200 (e.g., if the vertical space is divided into thirds, the nozzles 410 and 420 can be substantially within the middle third). However, other configurations may be used. In one embodiment, the first nozzle 410 supplies a first process gas to the upper space 101a of the inner space. The first process gas may be an inert gas. For example, the first process gas may be one of an argon (Ar) gas, a neon (Ne) gas, a helium (He) gas, a xenon (Xe) gas or the like. Also, the first process gas may be a gas in which at least two gases of the above gases are mixed with each other.

Figure 3:
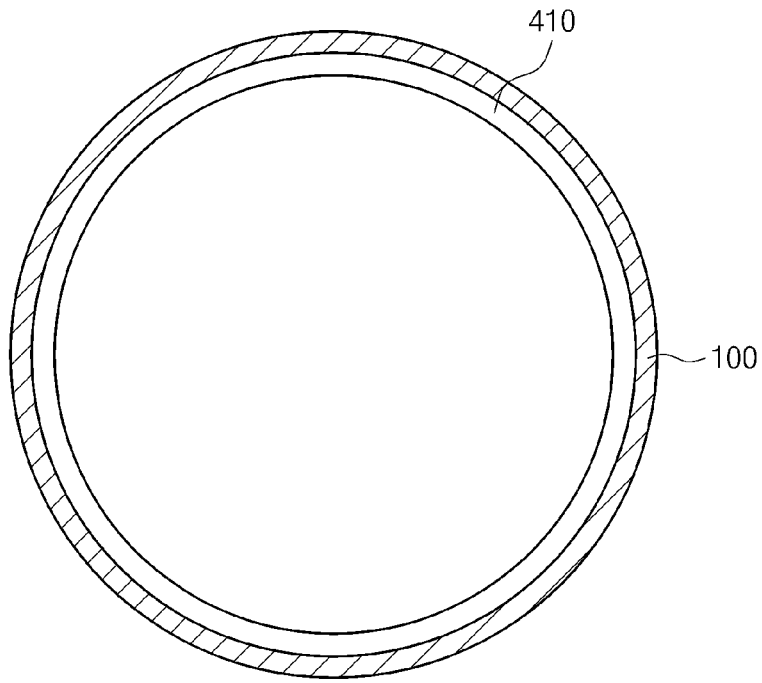
FIG. 3 is a cross-sectional view taken along line A-A' of FIG. 2, according to one embodiment.

FIG. 3 is a cross-sectional view taken along line A-A' of FIG. 2.

Referring to FIGS. 2 and 3, the first nozzle 410 is formed on the sidewall of the process chamber 100 along a circumferential direction of the process chamber 100. When an inner wall of the process chamber 100 has a circular shape, the first nozzle 410 is formed in a ring shape on the inner wall of the process chamber 100. The first nozzle 410 is formed to be inclined upward as going from an outside of the process chamber 100 to an inside. Therefore, the process gas sprayed from the first nozzle 410 is sprayed in a ring shape toward the upper space 101a of the process chamber 100.

The first nozzle 410 is connected to the first supply member 430 through a first line 431. In one embodiment, the first supply member 430 includes a storage tank storing the first process gas. Also, the first supply member 430 may include a mass flow controller (MFC) controlling a flux of the first process gas that is supplied to the first nozzle 410. A first valve 432 opening and closing the first line 431 may be provided on the first line 431. An end of the first line 431 connected to the first nozzle 410 may be provided to be inclined upward in the same direction as the first nozzle 410.

In certain embodiments, the first line 431 includes a plurality of outlets, which may also be described as a plurality of lines, around the circumference of the process chamber 100 to evenly release gas through the ring-shaped nozzle 410 into the process chamber 100. For example, in one embodiment, a first supply member 430 connects through a valve 432 to a first line 431 split into a plurality of lines (e.g., after the valve), to introduce gas into the process chamber 100. Each of the split lines may be angled as shown, for example, in FIG. 2. The first supply member 430 combined with the valve 432 and the first line 431 (e.g., including a plurality of split lines) may be referred to herein as a first gas supply device.

Figure 4:
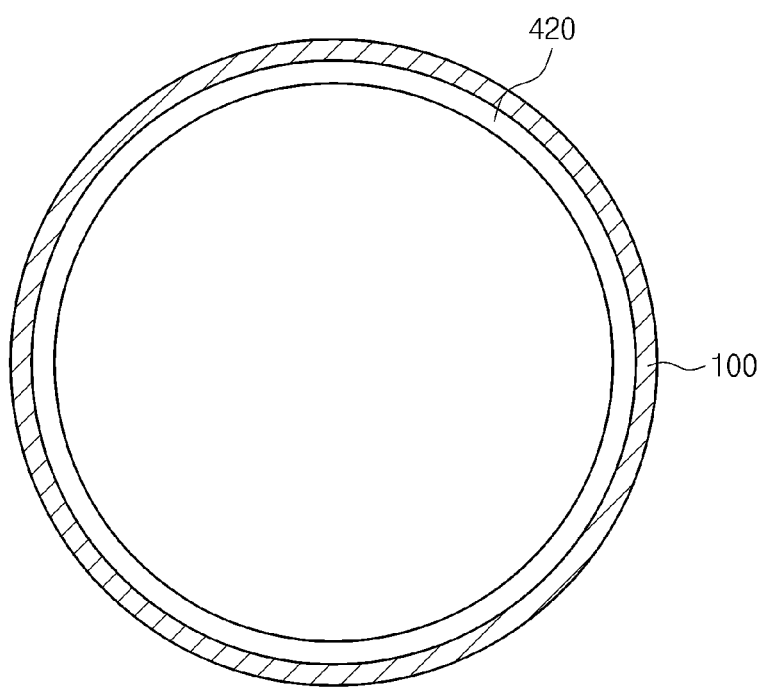
FIG. 4 is a cross-sectional view taken along line B-B' of FIG. 2, according to one embodiment.

FIG. 4 is a cross-sectional view taken along line B-B' of FIG. 2.

Referring to FIGS. 2 and 4, the second nozzle 420 may be disposed on a sidewall of a central portion of the process chamber 100, which is spaced apart from an upper surface of the support member 200 and a lower surface of the dielectric block 351. The second nozzle 420 is disposed above the first nozzle 410. The second nozzle 420 supplies a second process gas to a lower space 101b of the inner space. The second process gas may be, for example, a hydrogen gas.

The second nozzle 420 is formed on a sidewall of the process chamber 100 along a circumferential direction of the process chamber 100. When an inner wall of the process chamber 100 has a circular shape, an end of the second nozzle 420 is formed in a ring shape on the inner wall of the process chamber 100.

The second nozzle 420 is formed to be inclined upward as going from an outside of the process chamber 100 to an inside. Therefore, the second process gas sprayed from the second nozzle 420 intersects with the first process gas to be sprayed in a ring shape toward the lower space 101b of the process chamber 100 in which the support member 200 is disposed.

The second nozzle 420 is connected to the second supply member 440 through a second line 441. In one embodiment, the second supply member 440 includes a storage tank storing the second process gas. Also, the second supply member 440 may include a mass flow controller (MFC) controlling a flux of the second process gas that is supplied to the second nozzle 420. A second valve 442 opening and closing the second line 441 may be provided on the second line 441. An end of the second line 441 connected to the second nozzle 420 may be provided to be inclined upward in the same direction as the second nozzle 420.

In certain embodiments, the second line 441 includes a plurality of outlets, which may also be described as a plurality of lines, around the circumference of the process chamber 100 to evenly release gas through the ring-shaped nozzle 420 into the process chamber 100. For example, in one embodiment, a second supply member 440 connects through a valve 442 to a second line 441 split into a plurality of lines (e.g., after the valve), to introduce gas into the process chamber 100. Each of the split lines may be angled as shown, for example, in FIG. 2. The second supply member 440 combined with the valve 442 and the second line 441 (e.g., including a plurality of split lines) may be referred to herein as a second gas supply device.

The first and second nozzles 410 and 420 may be formed, for example, as first and second respective openings in the sidewall of the process chamber 100. In certain embodiments, an additional component may be placed in the openings for spraying the gas, but in either case, a nozzle is formed. However, one benefit of using the sidewall of the process chamber 100 itself as the nozzle instead of using a separate component, is that it simplifies the manufacturing process and can reduce the number of parts that may need maintenance.

In certain embodiments, as shown, the openings in the sidewall of the process chamber 100 may have an angled direction with respect to a line perpendicular to the sidewall in a horizontal direction. In certain embodiments, openings in the sidewall of the process chamber 100 are structured such that gas exiting the nozzle is directed in a direction angled with respect to a line perpendicular to the side wall in a horizontal direction. For example, the different nozzles may be configured to either spray gas in an upward direction (with respect to that perpendicular line) or a downward direction.

Since certain nozzles are described herein as having a ring shape, those nozzles may be referred to as ring nozzles. For example, each individual ring nozzle shown for example in FIGS. 3 and 4 extends around the circumference of the process chamber.

An annealing process using plasma (e.g., a plasma environment) may be performed with respect to the substrate W for improving roughness. In an example, a transistor may be formed on the substrate W. A channel among elements constituting the transistor accounts for a greatest proportion of total resistance of the transistor. An increase of a scattering on a surface of the substrate W according to roughness generated in treating the substrate W, reduces mobility of carriers. The roughness of the surface of the substrate W may be reduced through an annealing process.

The annealing process using plasma may use a gas in a radical state. In an example, when hydrogen in a radical state operates on the surface of the substrate W, mobility of atoms on the surface of the substrate W is increased, so that atoms on a protrusion portion may be moved toward a lower portion. In a state where only a hydrogen gas is introduced into the process chamber 100, when the hydrogen gas is excited to a plasma state, the plasma state may be in an unstable state. Therefore, an inert gas together with the hydrogen gas is introduced for stability of the plasma state.

The inert gas introduced into the process chamber is also excited into an ion or the like. The inert gas has a mass greater than that of hydrogen. Also, the ion into which the inert gas is excited, has straightness. Like this, the ion into which the inert gas is excited, operates on the surface of the substrate W, and on the contrary, the surface of the substrate W may be damaged to worsen an operation property of the transistor included on the substrate W.

In the plasma treating apparatus according to an embodiment of the present disclosure, the first process gas that is an inert gas, is supplied to the upper space 101a of the process chamber 100. The first process gas is excited into a plasma state by the microwave applying unit 300.

The first process gas excited into the plasma state, operates on the second process gas located in the lower space 101b. The second process gas is excited into the plasma state by the first process gas to then operate on the substrate W. The substrate W is annealed by the second process gas in the plasma state. At this time, the first process gas is prevented from moving toward the lower space by the second process gas, so that an amount of the first process gas moving toward the substrate W disposed on the susceptor 210, may be minimized. Therefore, the first process gas in the plasma state operates on the substrate W, thereby preventing damage to the substrate W.

For example, in one embodiment, hydrogen gas may be injected in an obliquely downward direction toward the substrate, using an obliquely downward-oriented nozzle that directs the hydrogen gas obliquely downward, while inert gas that provides stability for the plasma state is introduced to the chamber in a slantingly upward direction (e.g., obliquely upward) away from the substrate and toward the microwave applying unit 300, using an obliquely upward-oriented nozzle that directs the inert gas obliquely upward. As a result, the injected inert gas may be separated from the substrate while the hydrogen gas is adjacent to the substrate.

Figure 5:
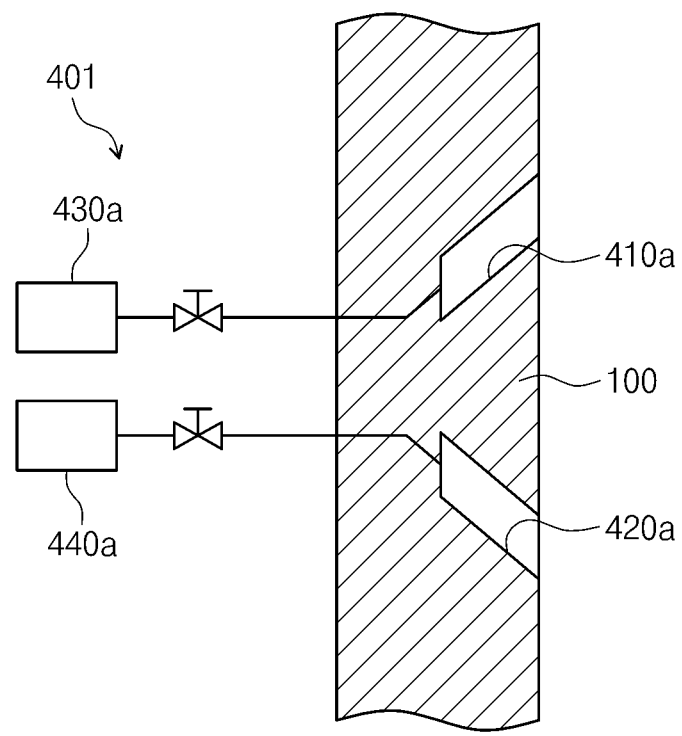
FIG. 5 is an enlarged view illustrating a gas supply unit according to another embodiment of the inventive concept.

FIG. 5 is an enlarged view illustrating a gas supply unit according to another embodiment of the inventive concept.

Referring to FIG. 5, a plasma supply unit 401 includes a first nozzle 410a, a second nozzle 420a, a first supply member 430a and a second supply member 440a.

The first nozzle 410a is disposed above the second nozzle 420a.

Configurations of the first supply member 430a and the second supply member 440a, and connection relations thereof with the first nozzle 410a and the second nozzle 420a other than disposition relations of the first nozzle 410a and the second nozzle 420a, may be provided in the similar or same manner as the gas supply unit 400 of FIG. 1. As such, in the embodiment of FIG. 5, hydrogen gas and an inert gas may be supplied to the process chamber 100 without crossing each other, such that one gas (e.g., an inert gas) may be supplied from an upper nozzle in an upward direction toward a microwave applying unit, and a second gas (e.g., hydrogen) may be supplied from a lower nozzle in a downward direction toward the substrate.

Figure 6:
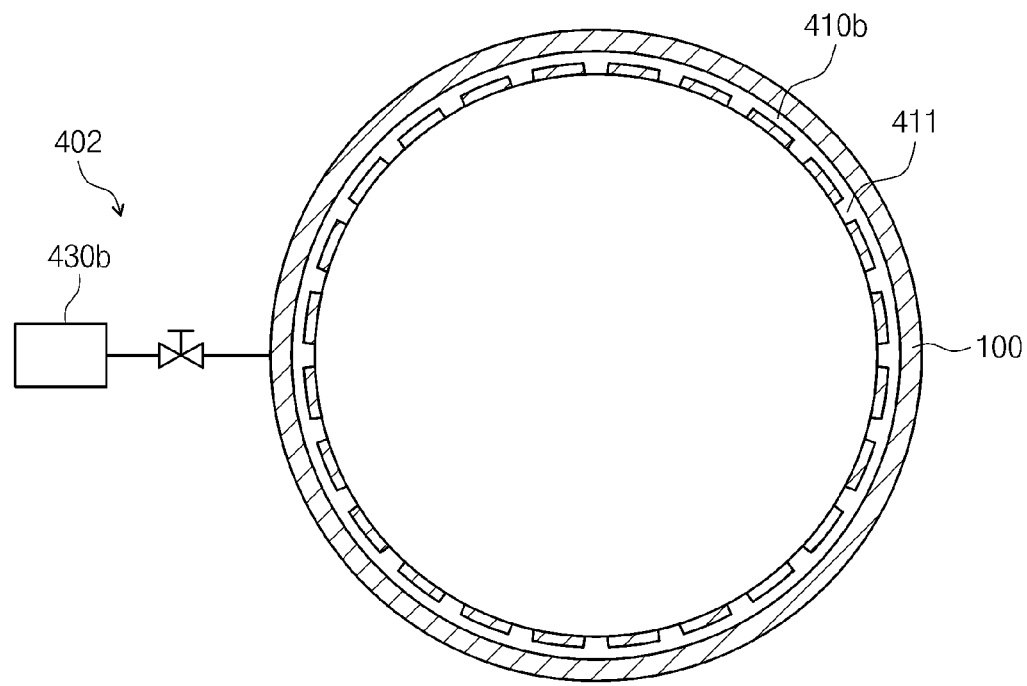
FIG. 6 is a cross-sectional view illustrating a first nozzle in a gas supply unit according to a further embodiment of the inventive concept.
Figure 7:
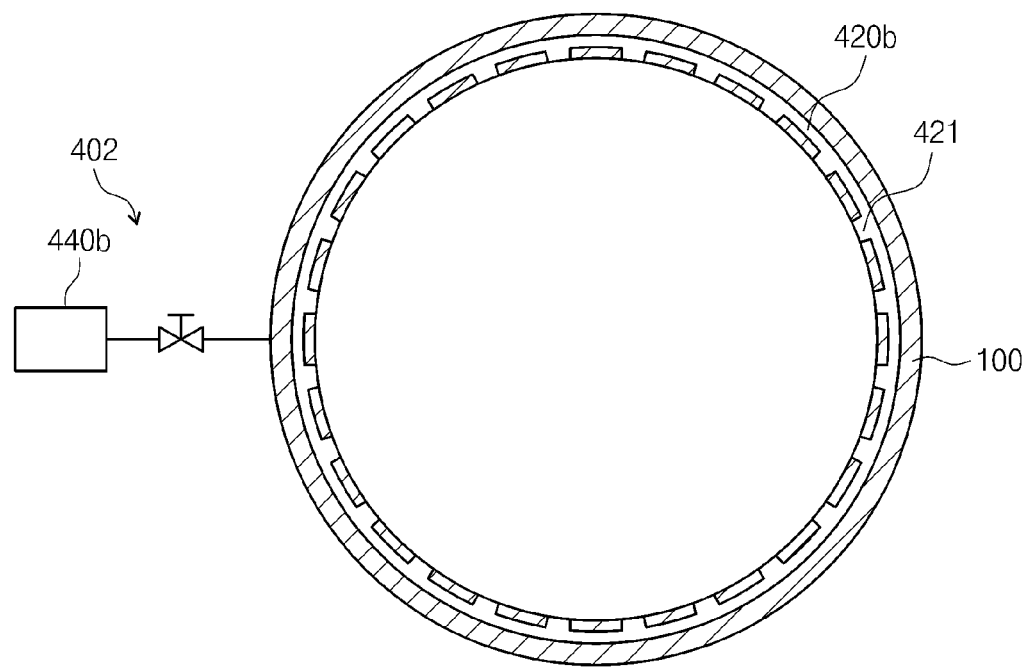
FIG. 7 is a cross-sectional view illustrating a second nozzle in a gas supply unit according to one embodiment of the inventive concept.

FIG. 6 is a cross-sectional view illustrating a first nozzle in a gas supply unit according to another embodiment of the inventive concept, and FIG. 7 is a cross-sectional view illustrating a second nozzle in a gas supply unit according to this additional embodiment.

Referring to FIGS. 6 and 7, a gas supply unit 402 includes a first nozzle 410b, a second nozzle 420b, a first supply member 430b and a second supply member 440b.

Configurations of the first supply member 430b and the second supply member 440b, and connection relations thereof with the first nozzle 410b and the second nozzle 420b may be provided in the similar or same manner as the gas supply unit 400 of FIG. 1.

The first nozzle 410b includes a plurality of first spray parts 411. The first spray parts 411 are provided in a hole shape directed toward an inner wall of the process chamber 100, and supply a first process gas to an inner space of the process chamber 100. The first spray parts 411 are formed to be inclined upward as going from an outside of the process chamber 100 to an inside in the similar manner as the first nozzle 410 of FIG. 2. The first spray parts 411 may be arranged along a circumferential direction of an inner wall of the process chamber 100. For example, the first spray parts 411 may form a plurality of repeated openings, rather than a single ring opening as in FIG. 3. Each of the repeated openings may be inclined upward in a similar manner as in FIGS. 2 and 3. Each individual opening may be referred to herein as a nozzle, or the entire set of repeated openings may be referred to as a nozzle.

The second nozzle 420b includes a plurality of second spray parts 421. The second spray parts 421 are provided in a hole shape directed toward an inner wall of the process chamber 100, and supply a second process gas to an inner space of the process chamber 100. The second spray parts 421 are formed to be inclined upward as going from an outside of the process chamber 100 to an inside in the similar manner as the second nozzle 420 of FIG. 2. The second spray parts 421 may be arranged along a circumferential direction of an inner wall of the process chamber 100. For example, the second spray parts 421 may form a plurality of repeated openings, rather than a single ring opening as in FIG. 4. Each of the repeated openings may be inclined upward in a similar manner as in FIGS. 2 and 4. Each individual opening may be referred to herein as a nozzle, or the entire set of repeated openings may be referred to as a nozzle.

In addition, a similar structure such as shown in FIGS. 6 and 7 may be used in an embodiment such as depicted in FIG. 5.

Figure 8:
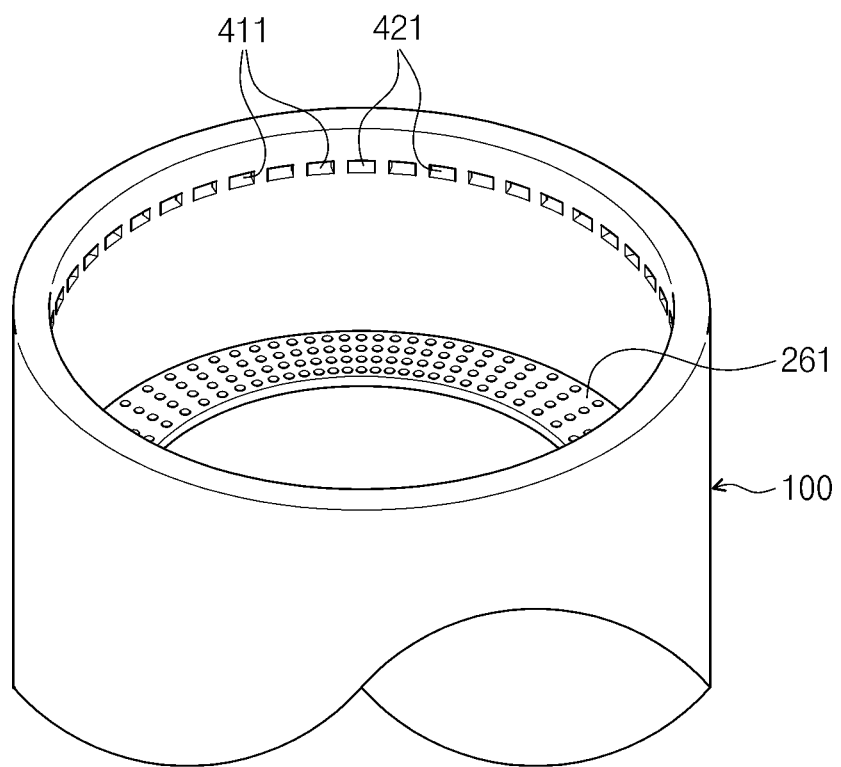
FIG. 8 is a view illustrating an inner surface of a process chamber in which a first spray part and a second spray part are formed, according to one embodiment.
Figure 9:
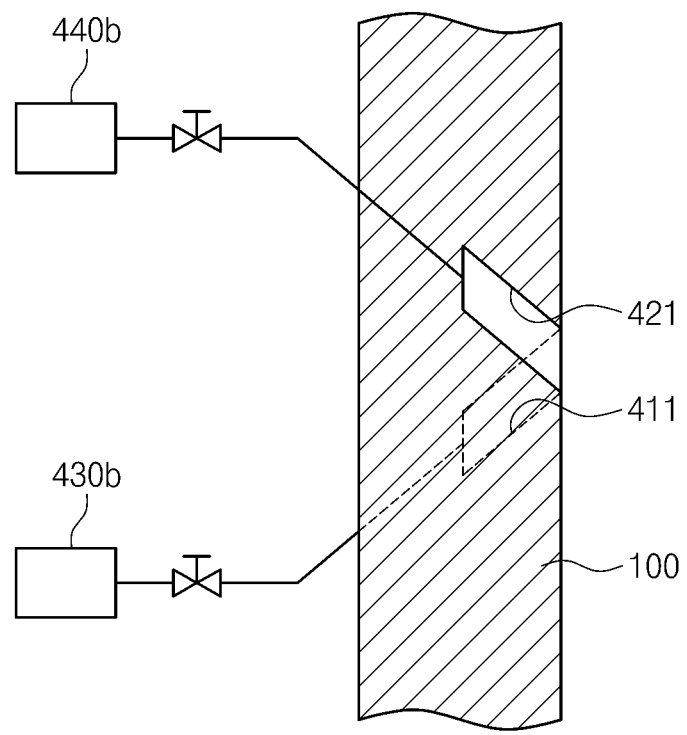
FIG. 9 is a side view illustrating a first spray part and a second spray part overlapping each other, according to one embodiment.

FIG. 8 is a view illustrating an inner surface of a process chamber in which a first spray part (e.g., nozzle) and a second spray part (e.g., nozzle) are formed, and FIG. 9 is a side view illustrating a first spray part and a second spray part overlapping each other.

Referring to FIGS. 8 and 9, the first spray part 411 and the second spray part 421 may be arranged so as not to overlap each other as viewed from above. Therefore, even when a spray direction of the first process gas and a spray direction of the second process gas intersect with each other, a mutual interference phenomenon may be minimized.

In the embodiment shown in FIGS. 8 and 9, ends (e.g., outlets) of the first spray part 411 and the second spray part 421 may be disposed at the same height on a sidewall of the process chamber 100. As such, in one embodiment, the outlets for gas to be sprayed in an upward direction alternate with outlets for gas to be sprayed in a downward direction.

Also, the first spray part 411 may be disposed under the second spray part 421 in the similar manner as the gas supply unit 400 of FIG. 2, such that the outlets are at different levels, but mutual interference is still minimized.

Also, the first spray part 411 may be disposed above the second spray part 421 in the similar manner as the gas supply unit 401 of FIG. 5.

Figure 10:
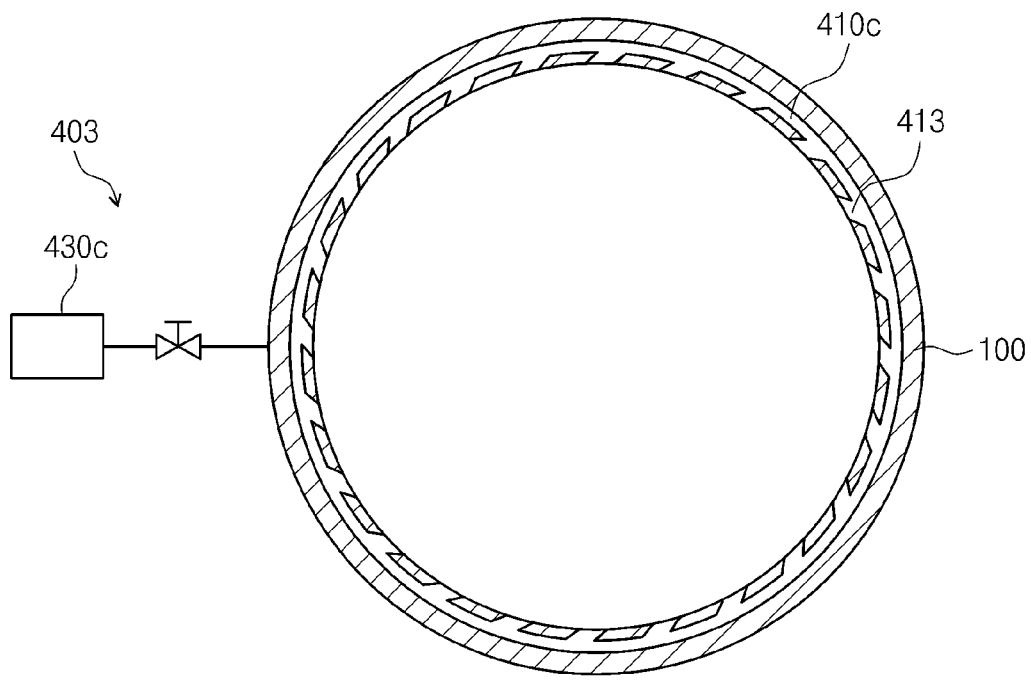
FIG. 10 is a cross-sectional view illustrating a first nozzle in a gas supply unit according to another embodiment of the inventive concept.
Figure 11:
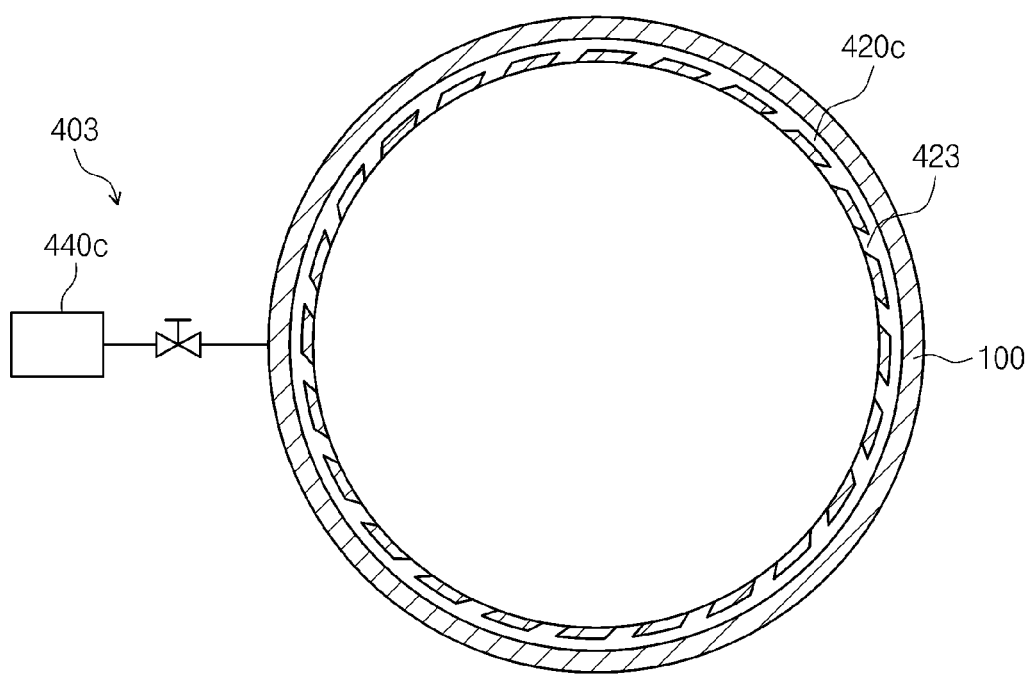
FIG. 11 is a cross-sectional view illustrating a second nozzle in a gas supply unit according to one embodiment of the inventive concept.

FIG. 10 is a cross-sectional view illustrating a first nozzle in a gas supply unit according to a further embodiment of the inventive concept, and FIG. 11 is a cross-sectional view illustrating a second nozzle in a gas supply unit according to that embodiment.

Referring to FIGS. 10 and 11, a gas supply unit includes a first nozzle, a second nozzle, a first supply member and a second supply member.

Configurations of the first supply member 430c and the second supply member 440c, and connection relations thereof with the first nozzle 410c and the second nozzle 420c may be provided in the similar or same manner as the gas supply unit 400 of FIG. 1.

The first nozzle 410c includes a plurality of first spray parts 413. The first spray parts 413 are provided in a hole shape directed toward an inner wall of the process chamber 100, and supply a first process gas to an inner space of the process chamber 100. The first spray parts 413 are formed to be inclined upward as going from an outside of the process chamber 100 to an inside in the similar manner as the first nozzle 410 of FIG. 2. The first spray parts 413 may be arranged along a circumferential direction of an inner wall of the process chamber 100. Also, the first spray parts 413 may be formed to be inclined with respect to a direction directed toward a center of an inside of the process chamber 100 as viewed from above. This may be referred to as sideways-inclined, or sideways-obliquely oriented. Therefore, the first process gas sprayed from the first spray part 413 may be supplied in a spiral shape to the upper space 101a of the process chamber 100, rather than concentrically toward a center of the process chamber 100.

The second nozzle 420c includes a plurality of second spray parts 423. The second spray parts 423 are provided in a hole shape directed toward an inner wall of the process chamber 100, and supply a second process gas to an inner space of the process chamber 100. The second spray parts 423 are formed to be inclined upward as going from an outside of the process chamber 100 to an inside in the similar manner as the second nozzle 420 of FIG. 2. The second spray parts 423 may be arranged along a circumferential direction of an inner wall of the process chamber 100. Also, the first spray parts 423 may be formed to be inclined with respect to a direction directed toward a center of an inside of the process chamber 100 as viewed from above. Therefore, the second process gas sprayed from the second spray part 423 may be supplied in a spiral shape to the lower space 101b of the process chamber 100. A sideways-inclined direction of the second spray part 423 may be formed in the same direction to that of the first spray part 413. Also, a sideways-inclined direction of the second spray part 423 may be formed in an opposite direction to that of the first spray part 413 as viewed from above.

Figure 12:
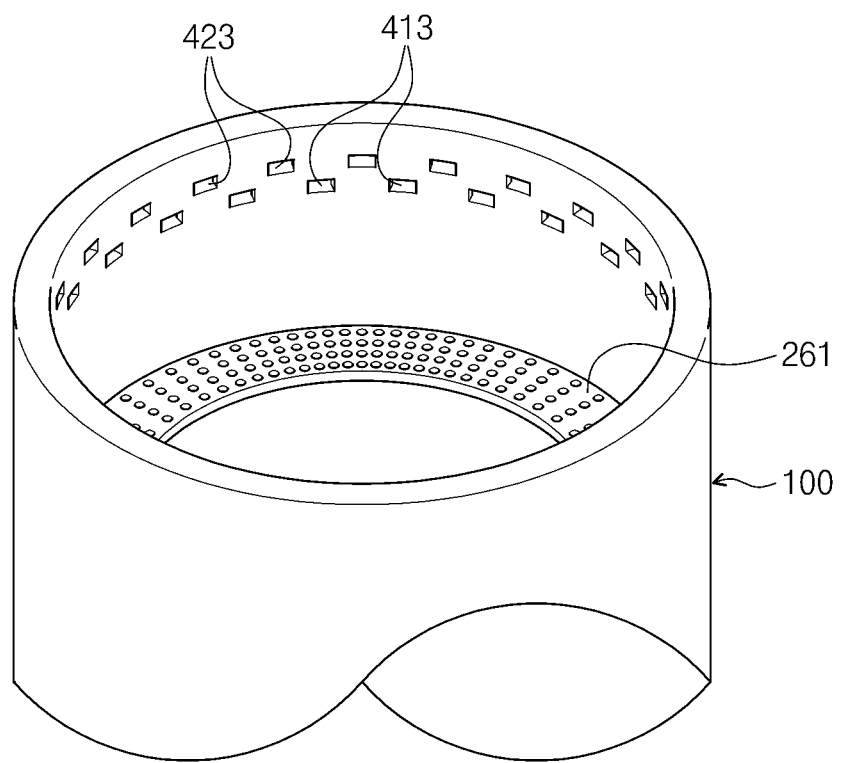
FIG. 12 is a view illustrating an inner surface of a process chamber in which a first spray part and a second spray part are formed, according to one embodiment.

FIG. 12 is a view illustrating an inner surface of a process chamber in which a first spray part and a second spray part are formed.

Referring to FIG. 12, a first spray part 413 is disposed under the second spray part 423. In one embodiment, the first spray parts 413 direct sprayed gas upward and the second spray parts 423 direct sprayed gas downward. Also, an end of the first spray part 413 and an end of the second spray part 423 may be arranged so as not to overlap each other vertically. Therefore, even when a spray direction of a first process gas and a spray direction of a second process gas intersect with each other, a mutual interference phenomenon may be minimized.

Also, the first spray part 413 may be disposed above the second spray part 423 in the similar manner as the gas supply unit 401 of FIG. 5.

Further, the first spray part 413 and the second spray part 423 may be arranged such that the end of the first spray and the end of the second spray part 423 are disposed at the same height in the similar manner as the gas supply unit 402 of FIG. 9. Further, one or more of the different spray parts 421 and 423 may be sideways-inclined, as discussed in connection with FIGS. 10 and 11.

While it is described that the support member 200 supports the substrate W as well as the electrostatic chuck 220 in the aforementioned embodiment, unlike this, the support member 200 may support the substrate W in various manners. For example, the substrate support member 200 may provided in a vacuum chuck that vacuum-adsorbs the substrate W and maintains the substrate in the vacuum absorption state. Other variations in the different described features may be used without departing from the spirit and scope of the disclosed embodiments.

Also, while it is described that the annealing process is performed by using plasma in the aforementioned embodiment, the substrate treating process is not limited thereto, and may instead be applied to various substrate treating processes, for example, a depositing process, an ashing process, an etching process, a washing process and the like.

According to the various embodiments described herein, a substrate may be efficiently treated.

In addition, the substrate may be used as part of a semiconductor device. For example, in a method of manufacturing a semiconductor device according to certain embodiments, after providing a substrate in a process chamber 100 and performing one of more of the substrate treating processes described above using one of the nozzle embodiments described above in connection with FIGS. 2-12 (e.g., for plasma treatment), the substrate may be formed into a semiconductor device such as an integrated circuit on a die (e.g., by performing various fabrication processes and singulating the die from a wafer that forms the substrate). The integrated circuit may form a semiconductor device such as a semiconductor chip, and the semiconductor chip may be packaged into a semiconductor device such as a semiconductor package (e.g., having a single chip on a package substrate, or multiple chips on a package substrate) or a package-on-package device. Also, the substrate may be processed to form a plurality of package substrates that form part of semiconductor devices such as packages.

The above detailed description exemplifies the present invention. Further, the above contents only illustrate and describe certain exemplary embodiments of the present invention and the various embodiments can be used under various combinations, changes, and environments. It will be appreciated by those skilled in the art that substitutions, modifications and changes may be made in these embodiments without departing from the principles and spirit of the general inventive concept, the scope of which is defined in the appended claims and their equivalents. The above-mentioned embodiments are used to describe a best mode in implementing the present invention. The present invention can be implemented in a other modes, however, such as modes not described herein or not described in the art. The detailed description of the present invention does not intend to limit the present invention to the disclosed embodiments.

What is claimed is:

1. A substrate treating method comprising:
   providing a substrate on a platform in a lower portion of an inner space of a process chamber;
   directing a first process gas upward from a first nozzle formed at an inner wall of the process chamber into an upper portion of the inner space, the first process gas being an inert gas and wherein the first nozzle is an obliquely upward-oriented nozzle structured to direct the first process gas upward;
   directing a second process gas downward from a second nozzle formed at a inner wall of the process chamber into a lower portion of the inner space, the second process gas being hydrogen gas and wherein the second nozzle is an obliquely downward-oriented nozzle structured to direct the second process gas downward; and
   applying a microwave to the upper portion of the inner space to excite the first process gas and the second process gas into plasma, and then processing the substrate.

2. The substrate treating method of claim 1, wherein the first nozzle is disposed under the second nozzle such that the first process gas and the second process gas proceed so as to intersect with each other.

3. The substrate treating method of claim 1, wherein the first nozzle has a ring shape, and the second nozzle has a ring shape.

4. The substrate treating method of claim 1, wherein the first nozzle sprays the first process gas through first spray parts that have a hole shape and are directed toward the inner space; and the second nozzle sprays the second process gas through second spray parts that have a hole shape and are directed toward the inner space.

5. The substrate treating method of claim 4, wherein the first spray parts and the second spray parts are arranged so as not to overlap each other.

6. The substrate treating method of claim 1, wherein a process performed in the inner space is an annealing process, a depositing process, an ashing process, an etching process, or a washing process.

7. The substrate treating method of claim 1, wherein the first nozzle is formed of the inner wall of the process chamber, and the second nozzle is formed of the inner wall of the process chamber.

8. A method comprising:
   placing a substrate on a platform in an inner space of a process chamber;
   directing a first process gas upward from an inner wall of the process chamber into an upper portion of the inner space, the first process gas being an inert gas and the inner wall being structured to direct the first process gas obliquely upward;
   directing a second process gas downward from the inner wall of the process chamber into a lower portion of the inner space where the substrate is located, the second process gas being hydrogen gas and the inner wall being structured to direct the second process gas obliquely downward;
   applying a microwave to the upper portion of the inner space to excite the first process gas and the second process gas into plasma; and
   processing the substrate in the plasma environment.

9. The method of claim 8, wherein:
   the inner wall of the process chamber includes a first nozzle oriented obliquely upward to direct the first gas upward from the inner wall of the process chamber; and
   the inner wall of the process chamber includes a second nozzle oriented obliquely downward to direct the second gas downward from the inner wall of the process chamber.

10. The method of claim 9, wherein the first nozzle comprises a first opening in the inner wall of the process chamber, and the second nozzle comprises a second opening in the inner wall of the process chamber.

11. The method of claim 9, wherein the first nozzle is vertically below the second nozzle.

12. The method of claim 9, wherein the first nozzle is vertically above the second nozzle.

13. The method of claim 9, wherein the first nozzle and second nozzle each include a plurality of outlets on the inner wall of the process chamber.

14. The method of claim 13, wherein the plurality of outlets of the first nozzle are at the same height as the plurality of outlets of the second nozzle.

15. The method of claim 14, wherein the outlets of the first nozzle are alternatingly arranged with the outlets of the second nozzle.

16. The method of claim 13, wherein each of the plurality of outlets of at least one of the first nozzle or the second nozzle are formed from holes in the inner wall of the process chamber that are sideways-obliquely oriented.

17. The method of claim 13, further comprising:
   directing at least one of the first process gas and the second process gas obliquely-sideways in a spiral manner.

18. The method of claim 8, wherein processing the substrate includes one of an annealing process, a depositing process, an ashing process, an etching process, and a washing process.

19. The method of claim 18, further comprising forming a semiconductor device from the substrate.

* * * * *